United States Patent [19]

Rose

[11] Patent Number: 4,476,150

[45] Date of Patent: Oct. 9, 1984

[54] PROCESS OF AND APPARATUS FOR LASER ANNEALING OF FILM-LIKE SURFACE LAYERS OF CHEMICAL VAPOR DEPOSITED SILICON CARBIDE AND SILICON NITRIDE

[75] Inventor: Douglas N. Rose, Macomb, Mich.

[73] Assignee: The United States of America as represented by the Secretary of the Army, Washington, D.C.

[21] Appl. No.: 496,366

[22] Filed: May 20, 1983

[51] Int. Cl.³ ............................................... B23K 9/00
[52] U.S. Cl. ...................................... 427/10; 427/53.1; 219/121 LZ
[58] Field of Search ........................... 427/8, 53.1, 10; 219/121 LA, 121 LB, 121 LZ

[56] References Cited

U.S. PATENT DOCUMENTS 3,585,088  6/1971  Schwuttke et al. ................. 427/531
3,700,850 10/1972  Lumley et al. ............... 219/121 LB
3,873,341  3/1975  Janus ................................. 427/53.1

OTHER PUBLICATIONS

Dutta et al., *Optical Engineering*, vol. 22, No. 1, Jan.-/Feb. 1983, pp. 117-120.

*Primary Examiner*—John H. Newsome
*Attorney, Agent, or Firm*—Peter A. Taucher; Gail S. Soderling; Robert P. Gibson

[57] ABSTRACT

A process of and related apparatus for achieving laser annealing of film-like surface layers of chemical vapor deposited silicon nitride and silicon carbide to relieve their inherent residual stresses. A laser beam is used to anneal the layers, in conjunction with a photoacoustic gas cell and related beam modulating means for utilizing a photoacoustic effect principal for monitoring, detecting and effectuating beam control as needed during the laser annealing process.

1 Claim, 2 Drawing Figures

PROCESS OF AND APPARATUS FOR LASER ANNEALING OF FILM-LIKE SURFACE LAYERS OF CHEMICAL VAPOR DEPOSITED SILICON CARBIDE AND SILICON NITRIDE

GOVERNMENT INTEREST

The invention described herein may be manufactured, used, and licensed by or for the Government for governmental purposes without payment to me of any royalty thereon.

BACKGROUND OF THE INVENTION

The present invention relates generally to the use of laser beams for annealing purposes. More specifically, it relates to the use of laser beams to relieve inherent residual stress in very thin layers of ceramic materials, such as film-like thin layers of chemically vapor deposited (CVD) silicon nitride ($Si_3N_4$) and silicon carbide (SiC) known respectively hereinafter as CVDSN and CVDSC. Structural ceramics are used in various systems relating to electronic, automotive, and military armor systems among others. Examples of substrate materials upon which the silicon nitride and silicon carbide may be chemically vapor deposited include graphite, mullite, and sintered silicon carbide.

Many studies have been previously conducted on laser interactions with various metals and semiconductors used in electrical circuit componetry. Examples of such latter studies include the following published articles:

Laser Induced Crystallization of Thin Semiconductor Films by H. P. Weber and W. Luthy, of the Institute of Applied Physics, University of Bern, Sidlerstrasse, 5, CH-3012 Bern, Switzerland, published on pg. 58–60 of the hardback book entitled "Proceedings of the International Conference on Lasers '79", by the STS Press of McLean, Va. 1980. Another such article on pgs. 775–783 in this same book is one entitled Laser Annealing of Semiconductors, by M. Bertolotti and G. Vitali, of the Institute of Fisica, University of Rome, in Italy.

The foregoing type of studies are of good interest but they relate to the specific non-analogous field of semiconductors, whereas it is believed that relatively little and only very limited study and research work has been done thus far in the field of laser processing of conventional ceramics and/or ceramic coatings. However, in this latter regard, one company so involved is United Technologies Research Center, in East Hartford, Conn. 06108, as evidenced by a recently published article entitled Observations of Laser Interactions with ceramics, by Francis S. Galasso and Richard Veltri. The brief article which duly acknowledges certain research center experiments by others and other bibliography contributions of interest, appears on pg. 253–254 in the February 1983 Issue (Vol. 52 No. 2) of the American Ceramic Society Bulletin. This article acknowledges among other things that attempts to heat ceramic bodies with a high intensity laser beam have usually resulted in crack formation and degradation. Notwithstanding this revelation, their studies have further revealed in one study regarding thermal barrier coatings on gas turbine engine components, that controlled crack formation by lasers in ceramics can be beneficial. However, their work involved the use of a high power nominally specified 6 KW $CO_2$ laser specifically with respect to obtaining or generating cracking through a $ZrO_2$-$Y_2O_3$ plasma sprayed coating on an apparently metal substrate, densifying the coating, alloying the coating with $Al_2O_3$, or selective evaporation of dye particles from the coating.

Further background concerning the general subject matter involves work performed by the San Fernando Laboratory in Pacoima, Calif. Within their advertising brochures they offer services more particularly pertaining to a specialized procedure for effecting chemical vapor deposition. Their patented process is believed to be named Controlled Nucleation Thermochemical Deposition (CNTD). The observed brochure did not describe or discuss any contemplated laser annealing or other laser treatment thereof.

Another recent brief article published in the March 1983 issue of Lasers and Applications, pg. 33–35 is entitled Excimer Annealing Produces Efficient Solar Cells. It briefly describes obtaining greater efficiencies in silicon solar cells which have been annealed with excimer lasers, apparently by Helionetics, Inc. of Irvine, Calif. However, from the brevity of the discussion therein, it appears that the described laser annealing process is also non-analogous to the instant disclosure because it appears related to the more specific aspect of silicon semiconductor annealing to improve electrical properties rather than to ceramics and the relieving of mechanical stresses.

A further recent article published in the January/February 1983 issue of Optical Engineering, Vol. 22, pg. 117–120 is entitled Use of Laser Annealing to Achieve Low Loss in Corning 7059 Glass, ZnO, $Si_3N_4$, $Nb_2O_5$, and $Ta_2O_5$ Optical Thin-Film Waveguides. It briefly describes obtaining lower optical loss in waveguides contemplated for thin film integrated optics. This was described as having been accomplished by annealing $Si_3N_4$ thin films with $CO_2$ laser irradiation. However it appears that their interest has been confined to its use in thin film integrated optics as exemplified by the publication of the article in Optical Engineering, wherein their goal is stated in the title to achieve low optical loss. This apparent intent is further strengthened by the absence of any reference to other uses of this laser annealing. This field has been quite separate from endeavors contemplating the use of CVDSN and CVDSC in structural applications such as in engines. The subject application is differently directed towards the use of CVDSN and CVDSC for wear, erosion, and corrosion protection to temperatures exceeding 1400° C.

BRIEF SUMMARY OF THE PRESENT INVENTION

Beneficial annealing of very thin layers of CVDSN and CVDSC is contemplated herein by utilizing a suitable laser beam generating device, such as a 4W or 6W Argon Ion laser. Other laser generator types, such as $CO_2$ or Neodimium YAG lasers, may be used also by skilled technicians. While a movably mounted laser mechanism may be arranged to provide scanning movement of a beam across a work surface, more practical arrangements contemplate leaving the laser beam generator in a fixed position and providing a movable mount or support stage for the workpiece, or else directing the laser beam using movable mirrors or other optical scanning techniques. In either arrangement, the CVDSN or CVDSC coated workpiece which has a coating typically between 0.001″ to 0.010″ is subject to effective scanning action of a laser beam. The beam power density is between approximately 1−(10 KW/cm$^2$) to generate a surface temperature of between about 1000°–1600° C. for exposure time periods of from approximately 10–200 milliseconds.

These exposure times and power densities will vary according to the absorption of the laser power and the heat transfer characteristics of the coating and substrate. The absorption depends not only on the intrinsic optical properties of the coating for the particular laser frequency used, but also on the surface finish and, in those cases where the laser light penetrates through the coating, on the coating/substrate interface, thickness of the coating, and optical absorption of the substrate. The heat transfer characteristics of the coating and substrate determine the temperature which the coating reaches from the energy it absorbs. For example, a thin coating on a more insulating substrate will require less power than a coating on a substrate that conducts heat readily. Accordingly, the residual stresses become relieved and other resultant advantages of these coatings are expected from this laser beam annealing treatment without disadvantages of loss of strength due to cracking, flaking or spalling from the otherwise non-relieved residual stresses. However, this technique is impractical for ceramic coatings that have a large difference in coefficient of thermal expansion compared to the substrate, since in that case the coating will crack or spall off during treatment.

Additional procedures contemplate the monitoring and controlling of the laser beam annealing process by a photoacoustic effect, and more particularly in instances where a CVDSN or CVDSC coating is reasonably believed capable of exhibiting non-uniform optical or thermal properties during the treatment process. These will be described in some further detail hereinafter, taken in conjunction with the illustrative drawing figures. While the CVD coatings or film-like layers will be in various thousands of an inch thickness, the exemplified layer thickness in the drawings is exaggerated for clarity.

MORE DETAILED BACKGROUND AND DESCRIPTION OF THE INVENTION

Figure 1:
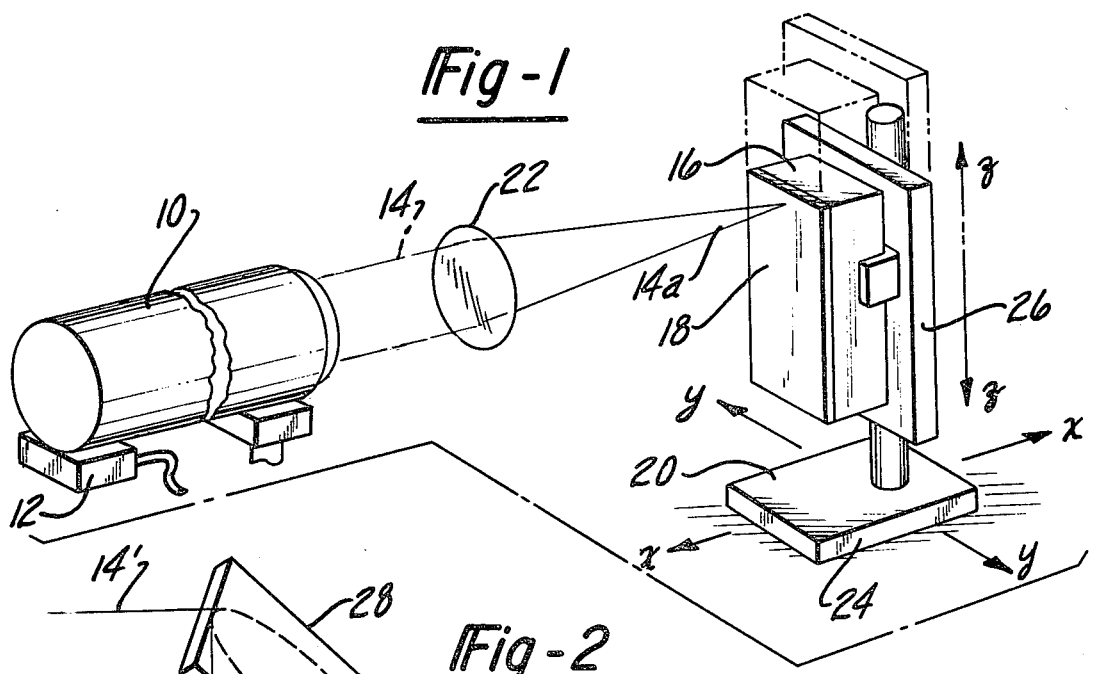
FIG. 1 is a generally diagrammatic perspective view of a movably mounted CVD ceramic-coated workpiece being subject to laser beam annealing.

Previous and ongoing studies by others have determined the following basic contemplated advantages of chemical vapor deposited silicon nitride and silicon carbide, again respectively to be denoted CVDSN and CVDSC hereinafter. These articles collectively appear in pg. 445–479 in the Brook Hill Publication Co. publication entitled "Ceramics For High Performance Applications—II" (1978), and on pg. 37 report "Reliability of Ceramics For Heat Engine Applications" of the Committee on Reliability of Ceramics for Heat Engine Applications, Nat'l Materials Advisory Board, Commission on Sociotechnical Systems, Nat'l Research Council, Publication NMAB-357, Nat'l Academy of Sciences, Washington, D.C. (1980).

1. CVDSN and CVDSC are of almost theoretical density, i.e., there is essentially no porosity for air or other gases to permeate and cause oxidation or other adverse reactions.

2. CVDSN and CVDSC are high purity materials and thus are very oxidation resistant, very creep resistant, and show very little change in strength with changes in temperature.

3. CVDSN when coated upon substrates of reaction bonded silicon nitride, of hot pressed silicon nitride and of sintered silicon nitride; and CVDSC as coated upon reaction sintered silicon carbide (also known as reaction bonded silicon carbide), upon hot pressed silicon carbide, and upon sintered silicon carbide, both have the advantages of:

(a) being the same material as the substrate and this avoiding
  (1) mechanical incompatibility due to different coefficients of thermal expansion; and
  (2) chemical incompatibility, due to formation of unwanted diffusion layers;

(b) lending erosion resistance to the substrate due to their high degree of hardness.

While CVDSC has appeared in bulk form for manufacturing turbine rotors and heat exchanger tubing and the like, this applicant's interest more particularly is directed toward the use of CVDSN and CVDSC for thin coatings for reaction bonded silicon nitride and reaction sintered silicon carbide, respectively, to protect against not only corrosion of the substrate, but also to provide stronger crack and spall resistant coated structures.

Among previous research studies, including some of those reports contained in the aforesaid book publication entitled "Ceramics For High Performance Applications—II" (1978), by the Brook Hill Publication Company, some studies have revealed several difficulties encountered while trying to attain the above noted contemplated advantages. These difficulties include increased partly needle like growth of the coatings at corners, whisker-like outgrowth on the whole surface, insufficient crystallinity of the coatings, poor surface quality, and decrease in strength of coated bend specimens, possibly caused by the presence of inherent residual stresses. While their continued research thereon reportedly resulted in overcoming some of these difficulties resulting in some improved surface textures, nevertheless a National Research Council review committee in 1980 then noted the still remaining problems of obtaining:

1. crackfree deposition on Si$_3$N$_4$ and SiC parts such as turbine rotors or the like;
2. uniform deposition on a part of complex shape;
3. non-nodular surface;
4. composition control, and
5. control of residual stresses.

As acknowledged hereinabove, laser annealing studies have been undertaken, but primarily in the non-analogous field regarding semiconductors. Therefore, considering the aforediscussed difficulties encountered thus far with CVDSN and CVDSC, it is of interest to note in passing and to compare those difficulties with what progress has been achieved with laser annealing of semiconductors. In this latter regard, it has been determined that through a liquid phase process involving epitaxial regrowth, an amorphous or polycrystalline silicon layer upon silicon substrates can be changed by laser irradiation into (1) single crystal layers with the same crystallographic orientation as the substrate in those cases where the liquid phase reaches into the substrate, or changed into (2) polycrystalline layers in those cases where the melt layer does not reach into the substrate. It was further determined that silicon layers which have been highly disrupted by ion implantation can be reordered with laser irradiation, wherein ultra rapid recrystallization occurs with the time duration at the high temperature of only about one microsecond.

Because it has been further determined that $Si_3N_4$ and SiC decompose (as into silicon and nitrogen, etc.) at elevated temperatures of about 2500°–3000° F., rather than melt, then it is concluded that the above observations do not apply directly to these ceramic materials or coatings. However, disordered crystals can reorder through simple thermal solid phase regrowth if they are held at a high enough temperature long enough. For example, in the aforementioned study in improving $Si_3N_2$ optical waveguides, lower optical loss resulted after exposure of only about 10 milliseconds. Also, solid phase reordering of amorphous silicon to polycrystalline has been observed.

From this more detailed background, it can be appreciated that residual stresses remain a problem to be overcome or contended with in CVDSN and CVDSC coatings. Further, from the foregoing discussion relative to laser annealing studies regarding semiconductors, and $Si_3N_4$ optical waveguides, it appears that laser annealing of CVDSN and CVDSC coatings on structural ceramics is attainable.

Accordingly, the present inventive process has been evolved whereby CVDSN and CVDSC layers are believed suitably subjectable to a laser to relieve the detrimental residual stresses either across an entire component part, or selectively at the more critical areas of a part. Photoacoustic microscopy and other means for monitoring by use of the photoacoustic effect are contemplated to be used to monitor and effect control of the laser beam-illuminated spot while this annealing process is in progress to thereby control the process. This is more particularly applicable to coating thicknesses which generally do not exceed approximately 0.050" to 0.080" inasmuch as it is believed that the photoacoustic effect monitoring is effective at depths of approximately 1 mm, or about 0.040".

The foregoing objectives and advantages will become more apparent to those skilled in the art from the following more detailed description taken in conjunction with the exemplary drawing figures.

Referring to FIG. 1, a laser-beam generator means 10 is suitably supported preferably in a fixed manner in association with an appropriate laser power supply and control means 12. In operation, means 10 and 12 generate a suitable laser beam 14 and includes means to vary the power and power density of the laser as is known in the laser control art. A workpiece 16, having a CVDSN and CVDSC coating 18, is suitably removably affixed onto a portable support assembly 20 capable of effecting travel of the ceramic-coated workpiece 16 in the path of the convergingly focused laser beam portion 14a. Suitable lens means 22 is used to focus the beam 14 if higher power density is required than is present in the original beam. The lens size, type and focal length will depend upon the particular application under treatment including whether the coated part to be treated is of planar or arcuate form.

Support assembly 20 may be of the motorized type with dual platforms 24,26 each adapted to be moved in various directions to provide control of the workpiece in three orthogonal planes or directions x-x, y-y and z-z. This mechanism or assembly is only shown schematically because it is well known in the art and does not constitute the crux of the invention.

In operation, an examplary laser such as a 6W Argon Ion laser is energized to produce beam 14 having a density of between approximately 1–10 KW/cm². Beam focused portion 14a terminates in a small size dot or spot area, the size of which will be controlled in part by the laser beam power density, so as to generate a surface temperature of between about 1000°–1600° C. for exposure times ranging between approximately 10–200 milliseconds. From this treatment, favorable reordering of the CVDSN or CVDSC coating structure is expected to occur so as to relieve the inherent residual stresses as previously described.

As an adjunct to the aforedescribed basic stress-relieving process of annealing CVDSN or CVDSC with a laser beam, it is believed that a novelly convenient method of monitoring and thus controlling the power density and/or other working effect of the laser beam would be by a known technique called photoacoustic microscopy. This basic technique involves use of a light beam to produce localized periodic heating of a sample surface, which produces an acoustical signal in gas over the heated spot. Historically, this photoacoustic effect was believed to have been first reported by Alexander Graham Bell in 1880, during which he studied the "optoacoustic" effect using air in a bell jar as a sample. By listening to the air molecules in the jar, by use of a hearing tube, while he illuminated them with chopped (or interrupted) sunlight, he was able to hear a faint sound at the chopping frequency. He observed that the sound became louder when the sunlight was brighter. Early researchers investigated the effect in gases and with solids and liquids. However, after attracting only a little experimental attention, this interesting effect was believed to have been long abandoned until somewhat revived in about 1938 for work with gases (M. L. Viengerov, Dokl Akad. Nauk SSSR 19,687,1938), and apparently not again applied to solids until the early 1970s. During this latter time, Bell Laboratory researchers reportedly began to study the absorption of light in solids using this rediscovered "optoacoustic" effect—now usually identified by its renamed term, "photoacoustic" effect, to avoid confusion with the "acoustooptic" effect in which light interacts with acoustic or elastic waves in a crystal.

As applied to solids, the photoacoustic effect begins with a modulated light beam incident on a solid, and wherein part of the beam's light is absorbed therein and through radiationless transitions is converted into heat. The heated surface of the solid heats the air or gas above it. When the solid area is enclosed within an air or gas-filled cell having a transparent window through which to pass the light beam, this heated air or gas causes a pressure increase within the cell. Because the light beam is modulated it produces periodic gas or air pressure and temperature variations at the same frequency which produce a sound, and which sounds or signals can be detected and transmitted by a miniature transducing microphone, such as the one-half inch condenser/transistor microphone of the type used in hearing aids and the like. This photoacoustic effect is dependent upon the absorption of the radiation and the subsequent heating of the surface on which the radiation (light beam) is incident. Thus the technique is sensitive to both optical absorption and thermal properties which include thermal boundary conditions. This recognized sensitivity to thermal properties allows the technique to probe beneath optically opaque surfaces. Use of an enclosed cell technique as generally described is but one manifestation called photoacoustic microscopy of utilizing the photoacoustic effect to monitor this process.

Figure 2:
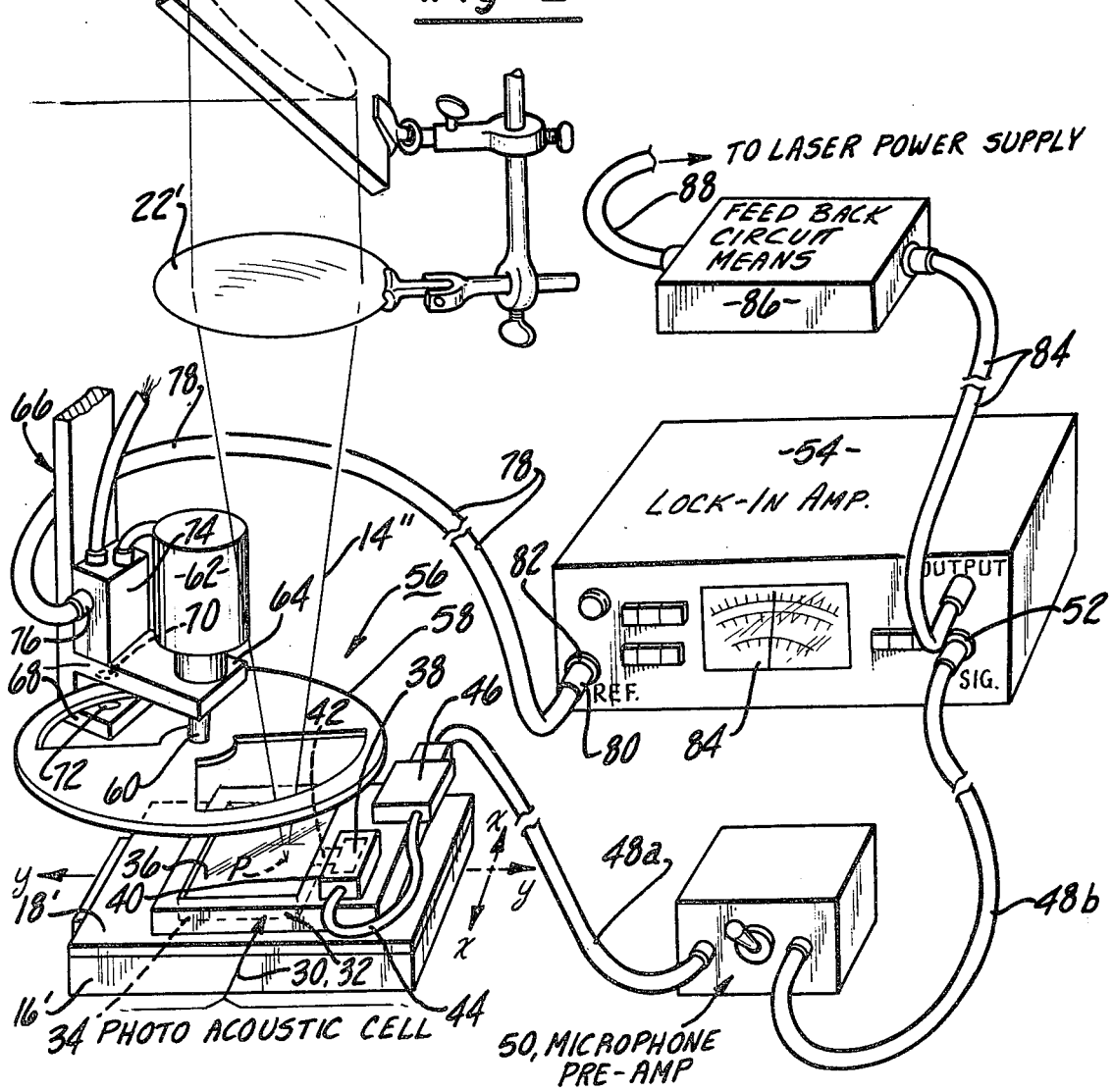
FIG. 2 is a perspective depiction of the process of and diagrammatic apparatus for one form of photoacoustic microscopy monitoring by photoacoustic effect of a modulated laser beam.

FIG. 2 represents an exemplary system for practicing this adjunct process. It is understood that a suitable laser beam source means comparable to that of 10, 12 in FIG. 1 is to be utilized in this embodiment, to produce a high energy laser beam 14'. Depending upon the arrangement of the system's various components, it may be necessary to use one or more mirrors to achieve the desired direction of the beam. In this example, a mirror 28 is angularly disposed to reflect beam 14' downward toward the workpiece 16'. A suitable lens 22' is appropriately supported in a position to effect focusing of the laser beam to a point P upon the workpiece 16'. Workpiece 16' is similarly coated with a layer 18' of CVDSN or CVDSC, and is to be anneal treated to relieve it of undesirable residual stresses.

A suitable photoacoustic cell assembly 30 is placed upon the coated surface 18' of the workpiece. Photoacoustic cells primarily intended for gas or small solid or liquid samples are commercially available from such companies as Photo-Acoustics of Rochester, Mich.; EG&G Princeton Applied Research Corporation in Princeton, N.J.; and Rofin, Inc. of Newton Upper Falls, Mass.

The cell to be described herein is more adapted to surfaces of larger parts though it utilizes the same principles. The body 32 is provided with an open bottom pocket or cell 34 covered at the upper-side by a sealed transparent window 36. Adjacent to the cell pocket 34 is a smaller pocket or more shallow cell 38 open face up to the body 32, but suitably covered by a miniature microphone 40. The smaller microphone cell 38 is in gaseous and acoustical communication via a lateral shallow connecting passageway 42. Microphone wiring 44 connects with a suitable terminal connecting block 46 which preferably is attached to the main cell's body 32. Detachable conductor wire cable 48a, in turn, connects the microphone 38 first with a suitable microphone preamplifier means 50, which may be powered by switch-controlled 1½ volt battery contained therein, and then via a second conductor wire cable 48b with an appropriate in-signal connector receptacle 52 on a lock-in amplifier means 54. Thus it is apparent that the noises or signals generated within the photoacoustic cell are amplified and transmitted as input signals to the lock-in amplifier 54. An example of a commercially available lock-in amplifier is the Model 186A Synchro-Het, manufactured by Princeton Applied Research Center and EG&G in Princeton, N.J. It is also understood that the microphone preamplifier means 50 may be of different design configuration and may be integrated with the photoacoustic cell as is the case with some commercially available cells.

To facilitate good results with these cells, the perimeter of the cell area should be in good, close contact with the coating surface. This can be achieved in various ways, one of which is to have the cell perimeter, at the underside thereof, coated with a thin layer of a suitable flexible sealing media, such as wax or wax-like substance. This will preclude leakage of the non-reactive gaseous media, such as air, helium or argon, from within the cell during the operation, thereby assuring that the spot upon which the modulated beam is focused becomes properly heated and will generate an appropriate signal to be detected and processed, as will be hereinafter described.

To further meet the prerequisites for establishing the photo-acoustic effect, i.e., that the laser beam becomes a modulated beam while focused on a work surface spot to heat the spot beneath the photoacoustic cell window, as well as means for continuously detecting the progressively heated spots as the work piece is moved relative to the focused beam spot, the exemplary beam-modulating means designated generally by the reference character 56, will now be described.

The illustrated beam-modulating means 56, is to be considered representative of such known device. One commercially available device is known as a Series 7510 Optical MicroChopper, manufactured by Rofin Inc., Newton Upper Falls, Mass. 02164.

Beam-modulating means 56 comprises a rotary slotted disc means 58 which includes conventional means for facilitating its removable attachment on the drive shaft 60 of the small electrical drive motor 62. Discs having a greater number of smaller size slots may be interchangeably used if desired. Motor 62 is suitably mounted upon an arm 64 of a support bracket 66 disposed to enable the focused beam portion 14" to pass through the slotted portions of the rotary modulating disc 58. Thus, it is apparent that during operation, the beam 14" is mechanically chopped or interrupted repeatedly to effect its modulation. Alternatively, the modulating means may chop or modulate beam 14'. The beam is preferably chopped generally in the audio frequency regime of approximately between 1 Hz and 20 KHz. The device further includes optical emitter-detector means disposed on opposite sides of the disc in a bifurcated portion 68 of the bracket 66. The latter means may include a small lamp or a light emitting diode (LED) 70 as the light source and an opposed small detector diode 72 such as a silicon photo detector, a cadmium sulfide detector or any similar type detector which responds to a light source so as to detect the chopped or interrupted light source 70. Such means may alternatively include small Infrared (IR) wave emitter-detector means. One form of optical emitter-detector sensors means is called an IR Sensor Limit Switch manufactured by General Instrument Company of Palo Alto, Calif. 94304.

Thus, the emitter-detector means 70,72 are appropriately wired to form part of the circuit means which effects conversion of the rate at which the laser beam is chopped into an appropriate electrical signal with at least part of the circuit means being within the bracket-mounted box housing 74. Housing 74 is provided with an appropriate terminal receptacle to receive one connector end portion 76 of a flexible coaxial conductor cable 78, of which the opposite end connector portion 80 is adapted to be received in reference signal connector receptacle 82 of the lock-in amplifier 54. Therefore the latter described means 70–80 establish an electronic reference signal input to the lock-in amplifier, in a parallel manner to the photoacoustic cell's pressure change modulated signal input at the aforesaid other receptacle 52, at the opposite side of said amplifier. The two distinct input signals into the lock-in amplifier 54 are processed internally in a known manner to provide a particular D.C. voltage, the voltage signal thereby being visually discernable on the voltage meter 84 of the amplifier 54. The produced D.C. voltage is proportionate to that part of the input signal that is at the same frequency as the reference signal and at a set or chosen phase angle with respect to the reference signal.

The resultant signal is then transmitted out via conductor cable 84 as an output signal to an appropriate feedback circuit means 86 which may include microprocessor and/or other computer means in conjunction therewith, and then via a further conductor cable 88 to a laser power supply means (such as 12 in FIG. 1) to effectively and essentially instantaneously modify the laser beam strength or wave amplitude as conditions and desired mode may dictate. Use of lock-in amplifiers and related control circuit means are well known to electrical control engineers working in the art. It is understood that if a pulse type laser is used, then the control would be directed to controlling within limits the repetition rate of the pulsing means associated therewith. Thus, when the laser heated spot within the gas cell is discerned by the photoacoustical monitoring as becoming too hot, thereby endangering burning through the CVD layer or imparting any other adverse treatment effect, the feedback circuitry means are used to effectively control the laser beam's effective strength for the required time, including any increase or decrease or maintaining of the desired level of power as required during and throughout the laser treating or annealing process. This composite process is expected to favorably relieve the detrimental residual stresses.

One contemplated use of this novel process or method will be more particularly applicable to monitor and more effectively control the laser beam during laser treatment on CVD ceramic-coated substrates involving inhomogeneous characteristics such as where the substrate requires or otherwise has variations in layer thickness or density, thus resulting in non-uniform optical and thermal absorption properties. As a result, such conditions would inherently require close monitoring and accurate control of the laser beam strength or effect.

While the gas cell method of detecting and monitoring the heated laser spot has been described hereinabove, other known modes of detection include the so-called mirage technique, the I.R. Detector technique, reflection technique and piezoelectric detector technique. These will be discussed in greater detail in my related application directed to a broader contemplated concept of using the photoacoustic effect as a central or overall broader control means for various other processes in addition to the herein described process of laser beam annealing of thin layers of CVDSN and CVDSC.

In conclusion, while the invention hereof has been described and illustrated with some specificity relative to two embodiments, it is apparent that those skilled in the art may be able to make still other modifications without departing from the spirit and scope of the invention as defined in the appended claims.

What is claimed is:

1. Annealing apparatus for relieving residual stress in a porous-free ceramic film on a ceramic workpiece, wherein the film material is selected from silicon nitride and silicon carbide:

said apparatus comprising a laser beam generator (10), means (28) for directing the generated beam onto the ceramic film to locally heat the film to a sufficient degree to effect an annealing operation thereon;

photoacoustic means for sensing the temperature of the heated film while said film is receiving the laser beam, said sensing means comprising a hollow open-bottomed cell (34) overlying the ceramic film in the path of the laser beam; said hollow cell comprising a window (36) operable to pass the beam onto the film, and a perimeter wall in close contact with the ceramic film surface to confine and trap a body of gas within the enclosed space between the ceramic film and aforementioned window, and a microphone (38) exposed to the enclosed cell space for translating pressure changes in said space into electrical signals;

and means (56) for modulating the laser beam prior to its impingement on the aforementioned window; said modulating means comprising a rotary disc (58) having solid areas operable to interrupt the beam and slot areas operable to pass the beam, whereby when the disc is rotating the beam is applied to the ceramic film as a series of laser pulses, for thus allowing the heated film to effect a pulse-type heating action on the gas trapped within said cell;

the volume of the enclosed cell space being sufficiently small that pressure changes associated with the gas-heating action cause the microphone to produce a periodically fluctuating electrical signal.

* * * * *